United States Patent
Yoon

(10) Patent No.: US 7,590,009 B2
(45) Date of Patent: Sep. 15, 2009

(54) SEMICONDUCTOR MEMORY APPARATUS AND DATA MASKING METHOD OF THE SAME

(75) Inventor: Sang Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 132 days.

(21) Appl. No.: 11/646,449

(22) Filed: Dec. 28, 2006

(65) Prior Publication Data
US 2008/0062771 A1 Mar. 13, 2008

(30) Foreign Application Priority Data
Sep. 13, 2006 (KR) ............... 10-2006-0088742

(51) Int. Cl.
*G11C 7/10* (2006.01)
(52) U.S. Cl. ............... 365/189.02; 365/230.02; 365/189.14; 365/189.15; 365/189.16; 365/230.03
(58) Field of Classification Search ............ 365/189.02, 365/230.02, 189.14, 189.15, 189.16, 230.03
See application file for complete search history.

(56) References Cited

U.S. PATENT DOCUMENTS

| | | | |
|---|---|---|---|
| 6,459,651 B1 | 10/2002 | Lee et al. | |
| 6,654,310 B2 | 11/2003 | Nam | |
| 7,139,290 B2 | 11/2006 | Braun | |
| 2004/0148482 A1* | 7/2004 | Grundy et al. | 711/167 |
| 2005/0248995 A1* | 11/2005 | Davis et al. | 365/189.05 |
| 2007/0226590 A1* | 9/2007 | Nagai | 714/763 |

FOREIGN PATENT DOCUMENTS

| | | |
|---|---|---|
| JP | 2003-007060 | 1/2003 |
| JP | 2005-339659 A | 12/2005 |

* cited by examiner

*Primary Examiner*—Thong Q Le
(74) *Attorney, Agent, or Firm*—Venable LLP; Jeffri A. Kaminski

(57) ABSTRACT

A memory apparatus includes: a memory cell block; a data input part that performs signal processing to transmit general data and mask information input to the semiconductor memory apparatus to the memory cell block, and outputs the processed data and information; a broadband data line connected between the data input part and the memory cell block; a plurality of registers connected to the broadband data line that writes mask information transmitted through the broadband data line; and a multiplexer that selects mask information from one of the plurality of registers in response to a mask information selection signal, and outputs the selected mask information to the memory cell block.

19 Claims, 5 Drawing Sheets

PRIOR ART

PRIOR ART

SEMICONDUCTOR MEMORY APPARATUS AND DATA MASKING METHOD OF THE SAME

FIELD OF THE INVENTION

1. Technical Field

The present invention disclosed herein relates to a semiconductor memory apparatus, and more particularly, to a semiconductor memory apparatus having a data mask function and a data masking method of the same.

2. Related Art

Data masking is a method of preventing alteration of information written in a certain memory region using pre-stored mask information even if new data is written in a semiconductor memory apparatus, and is widely used in various semiconductor memory apparatuses.

As shown in FIG. 1, a conventional semiconductor memory apparatus includes a memory cell block 110, a pad 120, a serial to parallel converter (SPC) 130, a first latch unit 140, a repeater 150, a register 160, a multiplexer 170, and a second latch unit 180.

The number of data input/output pins the pad 120 has depends on memory capacity, model, or the like. FIG. 1 illustrates a pad including eight data input/output pins (DQ<0:7>).

The SPC 130 converts serial data input through each pin of the pad 120 to parallel data, and outputs the converted data to the first latch unit 140.

The first latch unit 140 latches the parallel data output from the SPC 130, and outputs the parallel data to the memory cell block 110 through a broadband data line GIO in response to a DINSTBP signal.

The repeater 150 amplifies one byte of mask information (hereinafter, referred to as DM) output from the SPC 130, and outputs it to the register 160. A repeater 150 is used because the drivability of the SPC is insufficient to safely transmit the DM to the register 160.

The register 160 outputs the DM to the multiplexer 170 in response to a DMRSTBP signal.

The multiplexer 170 outputs the DM or changes its output terminal level to a ground level, in response to a WRM (write with data mask) signal, a command for when concurrently processing data writing and data mask, and a WR (write) signal, which is a write command.

The second latch unit 180 latches the DM output from the multiplexer 170, and outputs the DM to the memory cell block 110 in response to a DMSTBP signal generated at the same time as the DINSTBP signal.

Data corresponding to the DM, among the data transmitted from the memory cell block 110 through the broadband data line GIO, blocks a path written in a memory region, thereby forming a data mask in the memory region and writing other data in a corresponding memory region.

Hereinafter, the operation of the data mask will be described in detail with reference to FIG. 2.

First, in order to perform the data mask operation, mask information DM should first be written in the register 160 of FIG. 1.

Therefore, a WRMR (write data mask register) command for writing the DM in the register 160 of FIG. 1 is input to the semiconductor memory apparatus, and the DM is input through the data input/output pins DQ<0:7> of the pad 120.

Then, data is input through the data input/output pins DQ<0:7> of the pad 120 in response to the WRM (write with data mask) command input after the WRMR.

At this time, as shown in FIG. 2, one byte of DM is input (0-7) for one clock period when burst length is 4 (Burst 4), but eight bytes of data are input (Q0-Q7), i.e., 64 bits, for two clock periods in response to the operation of burst length 8 (Burst 8). That is, the operating time period of the DM input is different from that of the data input.

The data (Q0-Q7) is input to the memory cell block 110, and at the same time, the DM (0-7) latched in the second latch unit 180 is input to the memory cell block 110, and thus data mask is performed.

As described above, since the conventional semiconductor memory apparatus has different operating time periods for mask information and data, it is impossible to use the broadband data line GIO to transmit the mask information to the register, and thus, an exclusive signal line should be additionally provided. In this case, since the signal level of the mask information extracted through the exclusive signal line is too weak, a repeater should also be added in order to stably transmit the mask information to the register. As a result, circuit size increases due to the data mask.

SUMMARY

Embodiments of the present invention provides a semiconductor memory apparatus and a data masking method of the same, capable of minimizing circuit size.

An embodiment of the present invention provides a semiconductor memory apparatus comprising: a memory cell block; a data input part that performs signal processing to transmit general data and mask information input to the semiconductor memory apparatus to the memory cell block, and outputs the processed data and information; a broadband data line connected between the data input part and the memory cell block; a plurality of registers connected to the broadband data line that write mask information transmitted through the broadband data line; and a multiplexer that selects one of the mask information from one of the plurality of registers in response to a mask information selection signal, and outputs the selected mask information to the memory cell block.

Another embodiment of the present invention provides a data masking method of a semiconductor memory apparatus comprising a memory cell block, a broadband data line connected to the memory cell block and transmitting general data and mask information, and a plurality of mask information writing registers connected to the broadband data line, the method comprising: writing mask information in the plurality of mask information writing registers at the same time as a pre-set general data burst length when a mask information write command is input; and selecting one of the plurality of mask information when a data write command with mask is input, and outputting the selected mask information to the memory cell block.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENT

Figure 1:
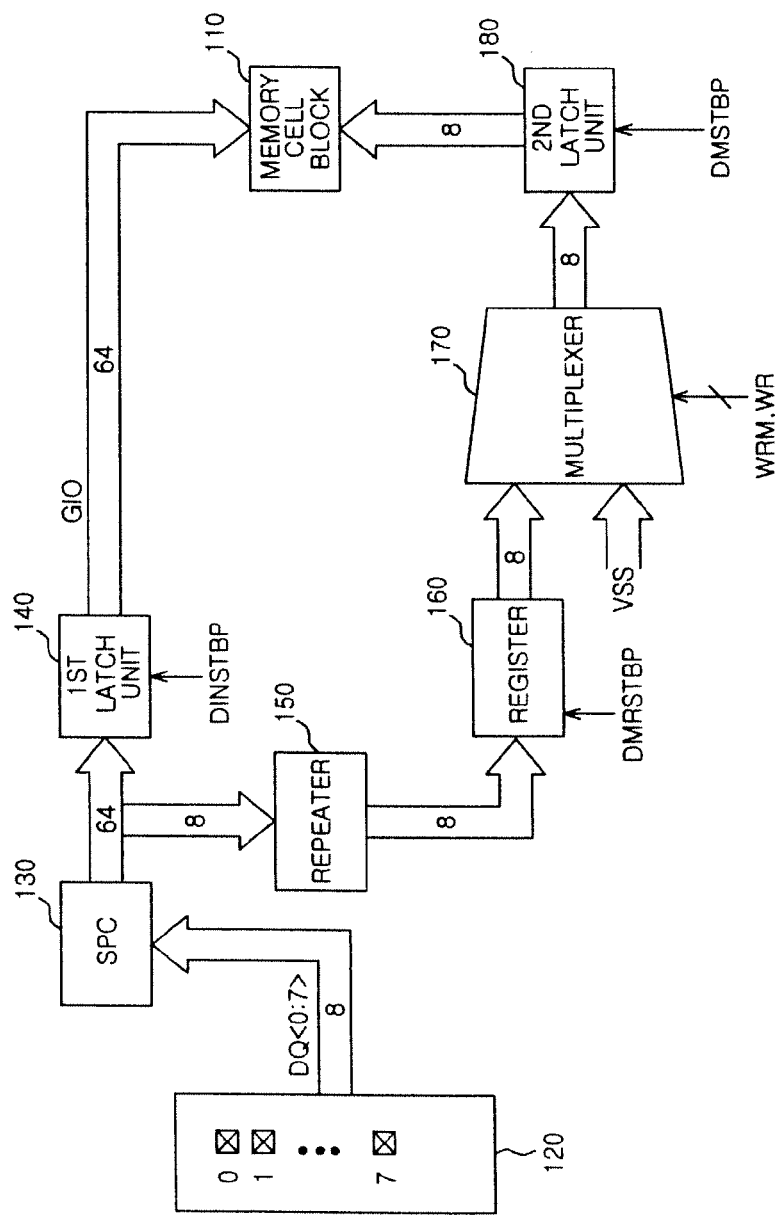
FIG. 1 is a block diagram of a conventional semiconductor memory apparatus.
Figure 2:
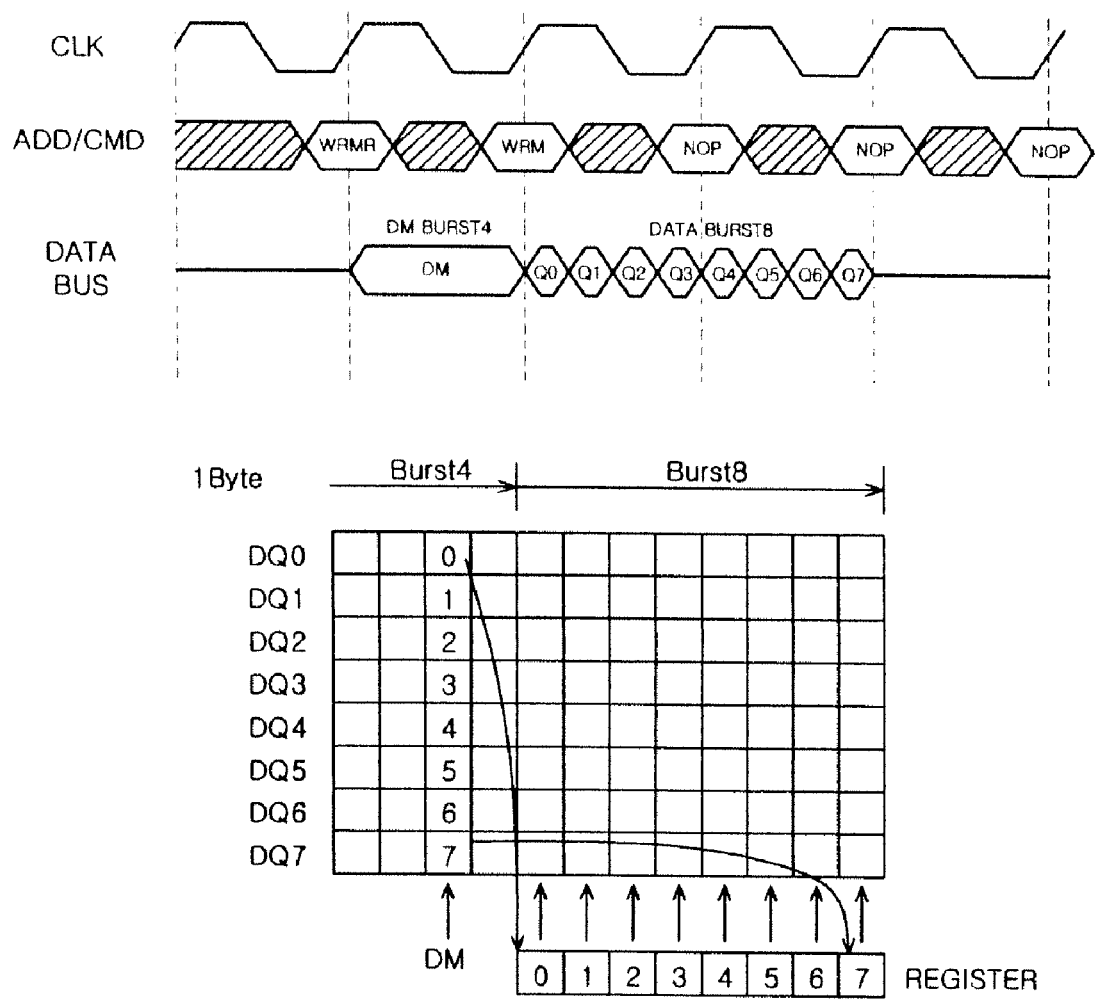
FIG. 2 is a diagram showing a data masking method of a conventional semiconductor memory apparatus.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Hereinafter, an exemplary embodiment of the present invention is described in conjunction with the accompanying drawings.

Figure 3:
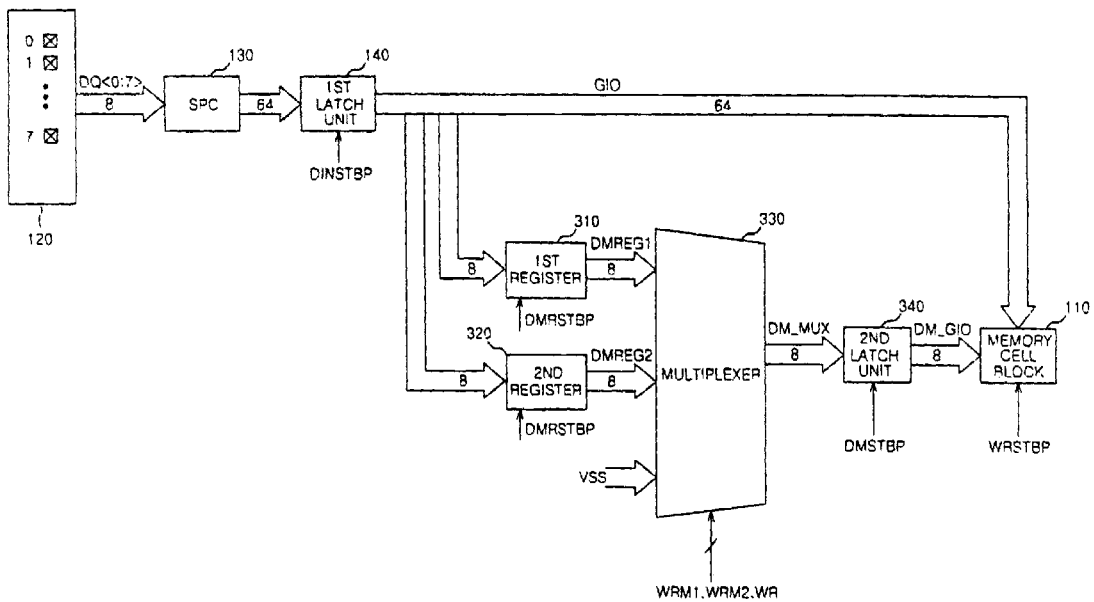
FIG. 3 is a block diagram of a semiconductor memory apparatus in accordance with an embodiment of the present invention.

As shown in FIG. 3, the semiconductor memory apparatus in accordance with the present invention includes a memory cell block 110, data input parts 120, 130 and 140, a broadband data line GIO, a first register 310, a second register 320, a multiplexer 330, and a second latch unit 340.

The memory cell block 110 may not write data corresponding to mask information in a corresponding memory cell, but it may write other data in the corresponding memory region. This is because a path for writing the data corresponding to the mask information in the memory cell may be blocked by the mask information. The memory cell block 110 may receive a predetermined control signal, i.e., a write control signal WRSTPB so it will not perform a write operation during a period in which mask information is transmitted through the broadband data line GIO. This is because mask information is transmitted through the broadband data line GIO to prevent the data from being written in the memory cell block 110.

The data input parts 120, 130 and 140 perform signal processing of general data and mask information input to the semiconductor memory apparatus such that they can be transmitted to the memory cell block, and output the processed data and information. The data input parts may include a pad 120 that has a plurality of data input/output pins DQ<0:7>, a serial to parallel converter (SPC) 130 that converts serial data input to the semiconductor memory apparatus through the pad 120 to parallel data, and a first latch unit 140 that latches the parallel data and outputs the parallel data to the broadband data line GIO in response to a first output control signal DINSTBP. Here, the first output control signal DINSTBP may be a signal generated in response to a write command input to the semiconductor memory apparatus during a time interval.

The broadband data line GIO may be coupled between the first latch unit 140 of the data input parts 120, 130 and 140 and the memory cell block 110. The broadband data line GIO may correspond to a write broadband data line WGIO when the semiconductor memory apparatus uses separate data lines, i.e., a data read line and a data write line.

The first and second registers 310 and 320 may be coupled to the broadband data line GIO, they may write mask information transmitted through the broadband data line GIO, and may output the mask information to the multiplexer 330 in response to a second output control signal DMRSTBP. The first and second registers 310 and 320 are used only as an illustrative example, but are not limited thereto, and three or more registers may be used. However, as described in the description of the related art, under the condition that the total burst length in which mask information is written in all the registers is equal to the burst length in which general data is written in the memory cell block 110, mask information can be transmitted using the broadband data line GIO. Therefore, it is possible to use a desired number of registers within a range satisfying the above condition. In this case, the burst length of mask information to be written in each register is determined depending on the burst length of the general data and the number of registers used.

The multiplexer 330 may select mask information from one of the first and second registers 310 and 320 in response to mask information selection signals WRM1, WRM2 and WR, and may output the selected information.

WRM1 is a command for selecting mask information from the first register 310, WRM2 is a command of selecting mask information of the second mask information, and WR is a general write command. The multiplexer 330 may change a voltage at its output terminal to a ground level VSS when WR is input.

The second latch unit 340 may latch the mask information output from the multiplexer 330, and output the latched mask information to the memory cell block 110 at the same time as data is output from the first latch unit 140 in response to a third output control signal DMSTBP. At this time, the third output control signal DMSTBP may be a signal generated at the same time as the first output control signal DINSTBP.

Hereinafter, an exemplary data mask operation of a semiconductor memory apparatus in accordance with an embodiment of the present invention will be described in detail with reference to FIGS. 4 and 5.

First, in order to perform the data mask operation, mask information DM should be first written in the first and second registers 310 and 320.

Figure 4:
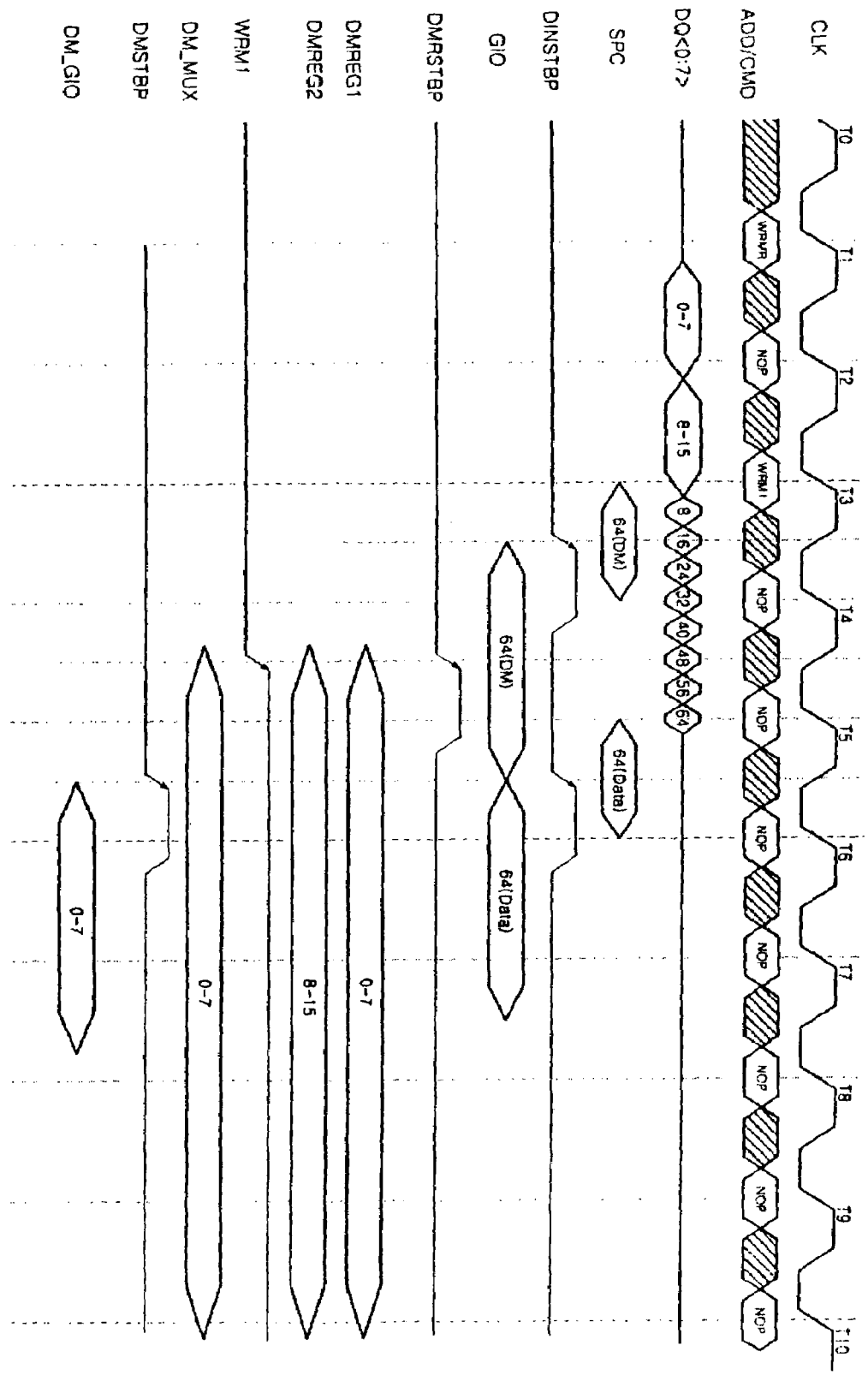
FIG. 4 is an operation timing diagram of a semiconductor memory apparatus in accordance with an embodiment of the present invention.

Therefore, as shown in FIG. 4, a command to write the DM, i.e., WRMR (write data mask register) may be input to the semiconductor memory apparatus, and the DM may be input through the data input/output pins DQ<0:7> of the pad 120 for two clocks T1 and T2.

Then, after the DM is input, general data may be input through the data input/output pins DQ<0:7> of the pad 120 for two clocks T3 and T4.

Next, the DM and the general data may be converted to parallel data through the SPC 130, and output to the first latch unit 140.

The first latch unit 140 may sequentially transmit the DM and the general data to the broadband data line GIO in response to the first output control signal DINSTBP.

Then, the first and second registers 310 and 320 may write DM (0-7) and DM (8-15) through the broadband data line GIO, and output DMREG1 (0-7) and DMREG2 (8-15) to the multiplexer 330 in response to the second output control signal DMRSTBP, respectively.

Next, the multiplexer 330 may select DMREG1 (0-7) as the output of the first register 310 in response to the WRM1 (write with data mask) command input after WRMR, and output DMREG1 (0-7) to the second latch unit 340.

Next, the second latch unit 340 may latch the DMREG1 (0-7), and output DM_GIO (0-7) to the memory cell block 110 in response to the third output control signal DMSTBP.

At this time, since the third output control signal DMSTBP is a signal generated at the same time as the first output control signal DINSTBP, the general data and the DM (0-7) may be input to the memory cell block 110 at the same time.

Therefore, the memory cell block 110 may perform a masking operation for data corresponding to the DM (0-7) among the general data, and may normally write the other general data.

Hereinafter, an exemplary DM writing and mask process will be described in detail with reference to FIG. 5.

Figure 5:
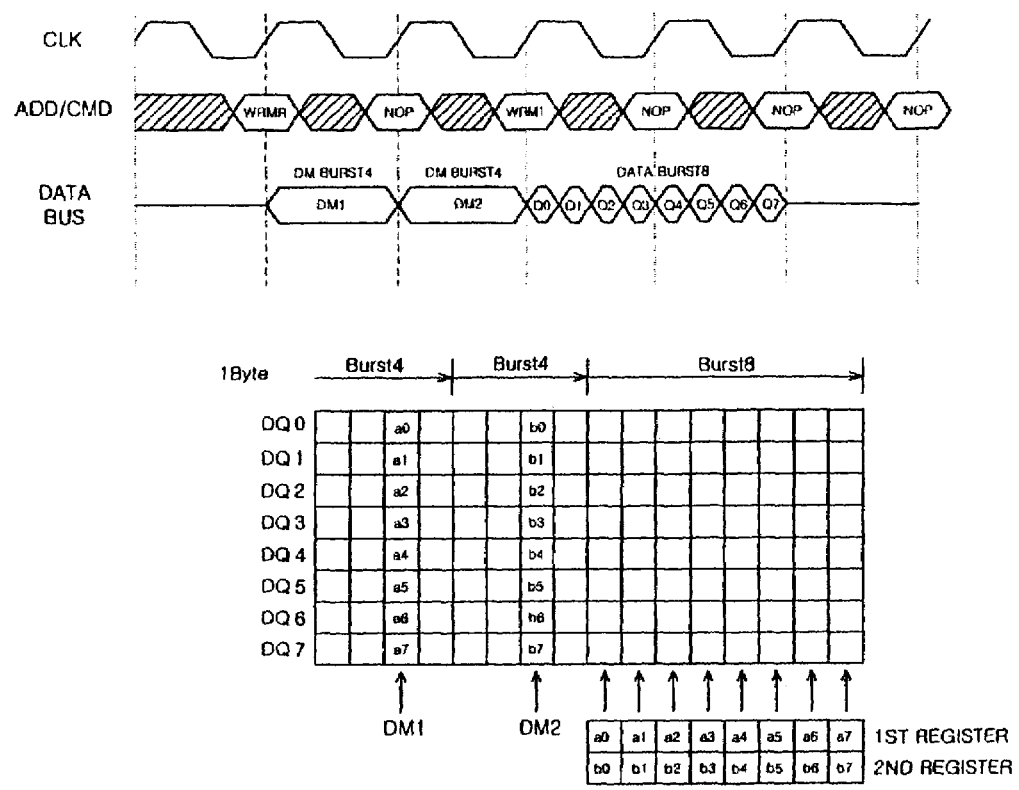
FIG. 5 is a diagram showing a data masking method of a semiconductor memory apparatus in accordance with an embodiment of the present invention.

As shown in FIG. 5, DM is divided into DM1 (a0-a7) for the first register 310 and DM2 (b0-b7) for the second register 320, which are input as each burst length 4 Burst4. Therefore, the total burst length of DM1 and DM2 is 8, which is the same as burst length 8 Burst8 of the general data (Q0-Q7). As a result, the burst lengths, i.e., operation time periods of the DM and the general data are equal to each other so that the general data (Q0-Q7) and the mask information can be transmitted together through the broadband data line GIO.

The burst length of the mask information may be determined depending on the burst length of the general data (Q0-Q7) and the number of registers. Since the number of registers 310 and 320 is two, the burst length of each register is four. If the number of registers is four, the number of mask information is also four, and each burst length of the mask information is two.

As described above, by making the total burst length of the mask information equal to the burst length of the general data, it is possible to transmit mask information through the broadband data line GIO. In addition, it is also possible to write mask information to a plurality of registers and selectively use the mask information.

As can be seen from the foregoing, a semiconductor memory apparatus and a data masking method in accordance with an embodiment of the present invention have various advantages as follows.

First, since mask information is written using a broadband data line GIO, there may be no need for an exclusive signal line and a repeater, and thus it is possible to minimize circuit size and increase the layout margin.

Second, since mask information can be written using a plurality of registers and used selectively, it is possible to improve convenience and performance of a data mask.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory apparatus comprising:
    a memory cell block;
    a data input part configured to perform signal processing to transmit general data and mask information input to the semiconductor memory apparatus to the memory cell block, and output processed data and mask information;
    a broadband data line coupled between the data input part and the memory cell block;
    a plurality of registers coupled to the broadband data line to write different mask information transmitted through the broadband data line; and
    a multiplexer configured to select one of the different mask information from one of the plurality of registers in response to a mask information selection signal, and output the selected mask information to the memory cell block, wherein an operation time period in which mask information is written in all the registers is equal to an operation time period in which data is written in the memory cell block.

2. The semiconductor memory apparatus according to claim 1, wherein the memory cell block is configured to receive a control signal to not perform a write operation during a period that the mask information is transmitted through the broadband data line based on the control signal.

3. The semiconductor memory apparatus according to claim 1, wherein the data input part comprises:
    a pad having a plurality of data input/output pins;
    a serial to parallel conversion part configured to convert serial data input from exterior of the semiconductor memory apparatus through the pad to parallel data; and
    a latch unit configured to latch the parallel data, and output the latched parallel data to the broadband data line in response to an output control signal.

4. The semiconductor memory apparatus according to claim 3, wherein the output control signal is a signal generated in response to a write command input to the semiconductor memory apparatus.

5. The semiconductor memory apparatus according to claim 1, wherein a burst length of the mask information is determined by a burst length of the general data and the number of the registers.

6. The semiconductor memory apparatus according to claim 1, further comprising a latch unit configured to latch the mask information output from the multiplexer, and output the mask information at the same time as the processed data is output from the data input part.

7. A semiconductor memory apparatus comprising:
    a memory cell block;
    a data input part configured to perform signal processing to transmit general data and mask information input to the semiconductor memory apparatus to the memory cell block, and output processed data and mask information;
    a broadband data line coupled between the data input part and the memory cell block;
    first and second registers coupled to the broadband data line to write different mask information transmitted through the broadband data line; and
    a multiplexer configured to select one of the different mask information from one of the first and second registers in response to a mask information selection signal, and output the selected mask information to the memory cell block, wherein an operation time period in which mask information is written in the first and second registers is equal to an operation time period in which data is written in the memory cell block.

8. The semiconductor memory apparatus according to claim 7, wherein the memory cell block is configured to receive a control signal and to not perform a write operation during a period that the mask information is transmitted through the broadband data line based on the control signal.

9. The semiconductor memory apparatus according to claim 7, wherein the data input part comprises:
    a pad having a plurality of data input/output pins;
    a serial to parallel conversion part configured to convert serial data input to the semiconductor memory apparatus through the pad to parallel data; and a latch unit configured to latch the parallel data, and output the latched parallel data to the broadband data line in response to an output control signal.

10. The semiconductor memory apparatus according to claim 9, wherein the output control signal is a signal generated in response to a write command input to the semiconductor memory apparatus.

11. The semiconductor memory apparatus according to claim 7, wherein the mask information written in the first register is written at a burst length corresponding to half of a general data burst length, and the mask information written in the second register is written at a burst length corresponding to the other half of the general data burst length.

12. The semiconductor memory apparatus according to claim 7, further comprising a latch unit configured to latch the mask information output from the multiplexer, and output the mask information at the same time as the processed data is output from the data input part.

13. A data masking method of a semiconductor memory apparatus comprising a memory cell block, a broadband data line coupled to the memory cell block that transmits general data and mask information, and a plurality of mask information writing registers coupled to the broadband data line, the method comprising:
- writing a plurality of mask information in the plurality of mask information writing registers at a same time as a pre-set general data burst length when a mask information write command is input; and
- selecting mask information from one of the plurality of mask information writing registers when a data write command with mask is input, and outputting the selected mask information to the memory cell block, wherein writing the plurality of mask information in the plurality of mask information writing registers comprises writing mask information in each of the mask information writing registers at a burst length defined by dividing the general data burst length by the number of registers.

14. The data masking method according to claim 13, further comprising stopping a write operation of the memory cell block using a predetermined control signal during a time in which the mask information is written in the mask information writing registers.

15. The data masking method according to claim 13, wherein the data write command with mask is defined corresponding to the number of the mask information writing registers.

16. A data masking method of a semiconductor memory apparatus comprising a memory cell block, a broadband data line coupled to the memory cell block that transmits general data and mask information, and first and second mask information writing registers coupled to the broadband data line, the method comprising:
- writing first and second mask information in the first and second mask information writing registers at the same time as a pre-set general data burst length when a mask information write command is input; and
- selecting one of the first and second mask information when a data write command with mask is input, and outputting the selected mask information to the memory cell block wherein writing the first and second mask information in the first and second mask information writing registers comprises:
- writing first mask information at a burst length corresponding to a portion of the general data burst length in the first register; and
- writing second mask information at a burst length corresponding to a remaining portion of the general data burst length in the second resister.

17. The data masking method according to claim 16, wherein writing the first and second mask information in the first and second mask information writing registers comprises:
- writing first mask information at a burst length corresponding to a half of the general data burst length in the first register; and
- writing second mask information at a burst length corresponding to the other half of the general data burst length in the second register.

18. The data masking method according to claim 16, further comprising stopping a write operation of the memory cell block using a predetermined control signal during a period in which the first and second mask information are written in the first and second registers.

19. The data masking method according to claim 16, wherein the data write command with mask is defined corresponding to each of the first and second registers.

* * * * *